United States Patent
Aaltonen et al.

(10) Patent No.: US 11,320,265 B2
(45) Date of Patent: May 3, 2022

(54) OFFSET-CANCELLING CAPACITIVE MEMS GYROSCOPE

(71) Applicant: MURATA MANUFACTURING CO., LTD., Nagaokakyo (JP)

(72) Inventors: Lasse Aaltonen, Espoo (FI); Anssi Blomqvist, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/998,433

(22) Filed: Aug. 20, 2020

(65) Prior Publication Data

US 2021/0063158 A1    Mar. 4, 2021

(30) Foreign Application Priority Data

Aug. 29, 2019 (FI) .................................... 20195711

(51) Int. Cl.
*G01C 19/5712* (2012.01)
*B81B 3/00* (2006.01)

(52) U.S. Cl.
CPC ........ *G01C 19/5712* (2013.01); *B81B 3/0018* (2013.01); *B81B 2201/0242* (2013.01)

(58) Field of Classification Search
CPC ............ G01C 19/5712; G01C 19/5776; G01C 19/5726; B81B 3/0018; B81B 2201/0242
See application file for complete search history.

(56) References Cited

U.S. PATENT DOCUMENTS

| | | | | |
|---|---|---|---|---|
| 5,983,718 A | * | 11/1999 | Wyse ................. | G01C 19/5705 73/504.12 |
| 6,588,274 B1 | * | 7/2003 | Kumada ................. | G01C 19/56 73/1.77 |
| 2010/0199763 A1 | * | 8/2010 | Zunft ..................... | G01C 19/56 73/504.12 |
| 2011/0041609 A1 | | 2/2011 | Clark et al. | |
| 2011/0192226 A1 | * | 8/2011 | Hayner ............... | G01C 19/5776 73/504.12 |
| 2013/0133397 A1 | * | 5/2013 | Kim .................... | G01C 19/5776 73/1.77 |

(Continued)

FOREIGN PATENT DOCUMENTS

| | | |
|---|---|---|
| EP | 3 455 586 A1 | 3/2019 |
| JP | 2019-515304 A | 6/2019 |
| WO | WO 2017/195020 A1 | 11/2017 |

OTHER PUBLICATIONS

Finnish Search Report dated Mar. 6, 2020 corresponding to Finnish Patent Application No. 20195711.

(Continued)

*Primary Examiner* — David J Bolduc
(74) *Attorney, Agent, or Firm* — Squire Patton Boggs (US) LLP (57) ABSTRACT

The present invention relates to a capacitive MEMS gyroscope with drive-signal induced offset cancelling features. In a MEMS gyroscope of the type including force feedback circuitry, the drive signal is modulated according to a known modulation scheme or frequency. The modulation scheme/frequency of the drive signal is used by offset cancelling circuitry to determine the offset in the rate signal caused by the drive signal. The determined offset is subsequently removed from the rate signal.

23 Claims, 7 Drawing Sheets

(56) References Cited

U.S. PATENT DOCUMENTS

| | | | |
|---|---|---|---|
| 2013/0152664 A1* | 6/2013 | Pyo | G01P 21/00 |
| | | | 73/1.38 |
| 2013/0197858 A1* | 8/2013 | Egretzberger | G01C 19/5712 |
| | | | 702/145 |
| 2015/0160632 A1 | 6/2015 | Buhmann | |
| 2015/0276407 A1 | 10/2015 | Bhandari | |
| 2015/0377625 A1* | 12/2015 | Aaltonen | G01C 19/5726 |
| | | | 73/504.12 |
| 2016/0334213 A1* | 11/2016 | DeWall | G01C 19/5684 |
| 2016/0377433 A1 | 12/2016 | Moriguchi | |
| 2017/0328712 A1 | 11/2017 | Collin et al. | |
| 2019/0145773 A1 | 5/2019 | Collin et al. | |
| 2019/0310106 A1* | 10/2019 | Furuta | G01C 19/5776 |

OTHER PUBLICATIONS

European Search Report dated Dec. 3, 2020 corresponding to European Patent Application No. 20189504.

Igor P. Prikhodko et al., "Continuous self-calibration canceling drive-induced errors in MEMS vibratory gyroscopes," 2015 Transducers-2015 18th International Conference on Solid-State Sensors, Actuators and Microsystems (Transducers), IEEE, Jun. 21, 2015, pp. 35-38, XP033189213.

\* cited by examiner

OFFSET-CANCELLING CAPACITIVE MEMS GYROSCOPE

TECHNICAL FIELD

The present invention relates to micro-electro-mechanical (MEMS) gyroscopes and especially to a MEMS gyroscope configured to cancel the offset in the gyroscope output caused by the effect of the gyroscope's drive signal.

BACKGROUND

Motion can be considered to have six degrees of freedom: translations in three orthogonal directions and rotations around three orthogonal axes. The latter three may be measured by an angular rate sensor, also known as a gyroscope. MEMS gyroscopes use the Coriolis effect to measure the angular rate. When a mass is driven in one direction and rotational angular velocity is applied about axis orthogonal to the driven axis, the mass experiences a force in the orthogonal direction with respect to both driven and rotated axes as a result of the Coriolis force. The resulting physical displacement caused by the Coriolis force may then be read from, for example, a capacitive, piezo-electrical or piezoresistive sensing structure.

In MEMS gyroscopes the primary motion is typically not continuous rotation as in conventional gyroscopes. Instead, mechanical oscillation is used as the primary motion. When an oscillating gyroscope is subjected to an angular motion, an undulating Coriolis force is produced. This creates a secondary oscillation orthogonal to the primary motion and to the axis of the angular motion and at the frequency of the primary oscillation. The amplitude of this coupled oscillation is used as a measure of the angular motion.

A MEMS gyroscope may comprise a body, and at least one inertial element with at least two degrees of freedom within the inertial reference frame. The inertial elements may comprise for example a drive element, also called as a primary element, suspended to the body for vibrational primary motion in a first direction, and a sense element, also called as a secondary element or as a Coriolis element, coupled to the drive element to receive an orthogonal Coriolis force component in a second direction, causing the sense element to move in a vibrational secondary motion. On the other hand, a single inertial element may be used which is configured to have a primary motion in a first direction, a secondary motion in another direction, which inertial element is also configured for a rotational motion in a third direction.

A mass-spring structure typically exhibits a resonance or a resonant behaviour by naturally oscillating at some frequencies, called "resonant frequencies", with greater amplitude than at other frequencies. At these resonant frequencies the displacement is much larger than at other frequencies at same excitation magnitude and, in the miniaturized dimensions of MEMS structures, cause non-linearity and/or over range condition that disturbs the detection.

These disturbances are typically eliminated by damping of the detected motion of a secondary element used for detection. In feed-back damping, or active damping, the detected displacement is monitored and a relative force is generated to oppose the motion. In some known systems, active damping has been implemented with a closed feed-back loop. In so called force feedback damping method, filtering and/or other signal processing is included in the feedback loop for adjusting the response function of the feedback loop.

Another challenge in gyroscope design is in minimising the offset in the output signal caused by the drive signal, which is used to drive the motion of the drive/primary element. The offset results in the gyroscope proving a non-zero output when the gyroscope is not subject to rotational motion. Offset due to the drive signal can be caused by a number of different mechanisms, such as direct electrical cross-talk due to parasitic capacitance from the drive electrodes to the sense electrodes, electrostatic excitation in the secondary direction due to imbalance of the drive structure, and coupling via non-zero impedance levels within the MEMS element. Other sources of error in the output offset, such as quadrature error and its compensation mechanism, are often dominating in the offset error. However, when these other sources of error are effectively compensated, the offset error due to drive signal becomes much more pronounced in comparison.

The offset of a given MEMS gyroscope is a highly relevant parameter in gyroscope applications such as navigation. When external rate of angular change is zero, but the gyroscope output indicates a non-zero rate, it causes the rate integration to drift towards an increasingly incorrect angle value. In practice, this limits the length of time that the sensor can be used to provide an accurate indication of orientation. Similarly, in inertial navigation, where the rotation of the Earth needs to be measured at higher precision than a mdps ($10^{-3}$°/s), offset/drift mechanisms are problematic since they cannot be predicted and therefore mdps-accuracy is not attainable.

SUMMARY OF THE INVENTION

According to a first aspect of the invention, a MEMS gyroscope is provided. The MEMS gyroscope comprises:
at least one mechanical resonator;
drive circuitry configured to apply a drive signal to the at least one mechanical resonator to drive motion of the at least one mechanical resonator in a first direction; and
sense circuitry configured to sense motion of the at least one mechanical resonator in a second direction, the second direction being orthogonal to the first direction, and to output a rate signal proportional to the amplitude of the sensed motion of the mechanical resonator in the second direction.

The sense circuitry includes a closed force feedback loop forming an electromechanical resonator loop configured to adjust the frequency response of the at least one mechanical resonator in the second direction.

The invention is characterised in that the drive circuitry is further configured to modulate the drive signal and in that the MEMS gyroscope further comprises offset compensation circuitry configured to determine the effect of the drive signal on the sense signal based on the modulation of the drive signal and, subsequently, to counteract the effect of the drive signal on the rate signal.

The settling time of the at least one electromechanical resonator loop in the second direction may be significantly shorter than the settling time of the at least one mechanical resonator in the first direction. Specifically, the settling time of the at least one electromechanical resonator in the second direction may be less than 0.5 ms with 1% precision.

The sense circuitry may be configured to sense the motion of the at least one mechanical resonator capacitively.

The closed force feedback loop may comprise the mechanical resonator, a filter and an amplifier, and wherein the Q value of the amplifier is below 3, preferably between 1 and 2.

The at least one mechanical resonator may comprises a first mechanical resonator and a second mechanical resonator. The first mechanical resonator is configured to move in the first direction and the second mechanical resonator is configured to move in the second direction, and the first mechanical resonator and second mechanical resonator are coupled such that rotation of the MEMS gyroscope about an axis orthogonal to both the first direction and second direction causes excitation of the second mechanical resonator in the second direction.

The drive circuitry may be configured to modulate the drive signal by alternating between a drive-on state and a drive-zero state. In this case, the offset compensation circuitry is configured to:
  determine an average value of the demodulated rate signal for a time period during which the direct effect of the drive signal is present in the rate signal;
  determine an average value of the demodulated rate signal for a time period during which the direct effect of the drive signal is substantially not present in the rate signal;
  and
  calculate the difference between the average value when drive effect is present and the average value when the drive effect is not present to determine a first offset value.

The phrase "substantially not present" means that the drive effect in the rate signal is less than 30% of the maximum drive effect.

The offset compensation circuitry may be further configured to:
  determine if the first offset value is lower than a threshold offset value and, if the first offset value is lower than the threshold offset value:
    enqueue the first offset value to a FIFO queue and dequeue an offset value from the FIFO queue;
    output the dequeued value from the FIFO queue as a second offset value; and
  if the offset value is higher than the threshold offset value, output the first value from the FIFO queue as the second offset value.

The threshold offset value may be a constant, or the offset compensation circuitry may be further configured to calculate the threshold offset value by calculating the sum of a fixed offset and an average offset value of some or all of the offset values stored in the FIFO queue. The offset compensation circuitry may be further configured to determine a third offset value by scaling the first or second offset value by the ratio of the time period during which the direct effect of the drive signal is present in the rate signal to the time period during which the direct effect of the drive signal is not present in the rate signal.

The offset compensation circuitry may be further configured to subtract the second or third offset value from the rate signal to produce an offset-corrected rate signal.

The drive circuitry may be configured to alternate between the drive-on and drive-off states at a frequency of at least 100 Hz, preferably at a frequency of more than 1 kHz The drive-on state may be maintained for approximately ⅛ of the period of the alternation.

Alternatively, the drive circuitry may be configured to modulate the drive signal linearly.

The modulation depth of the drive signal may be between 30% and 80% of the unmodulated drive signal.

The offset compensation circuitry may be further configured to:
  receive a modulation carrier wave, wherein the modulation carrier wave has the same frequency as the drive signal modulation;
  match the phase of the modulation carrier wave to the phase of the ripple in the rate signal caused by the modulation of the drive signal;
  multiply the modulation carrier wave and the rate signal and filter out high frequency components of the multiplied signal;
  determine an AC offset magnitude based on the amplitude of the multiplied and filtered signal and the amplitude of the modulation carrier wave;
  determine a DC offset based on the DC component of the drive signal and the ratio of the AC offset to the AC component of the drive signal; and
  combine the AC offset and DC offset to determine a first offset value.

The offset compensation circuitry may be further configured to determine if the first offset value is lower than a threshold offset value and, if the first offset value is lower than the threshold offset value:
  enqueue the first offset value to a FIFO queue and dequeue an offset value from the FIFO queue and output the dequeued value from the FIFO queue as a second offset value;
  and if the first offset value is higher than the threshold offset value output the first value from the FIFO queue as the second offset value.

The offset compensation circuitry may be further configured to subtract the first or second offset value from the rate signal to produce an offset-corrected rate signal.

DETAILED DESCRIPTION

Figure 1:
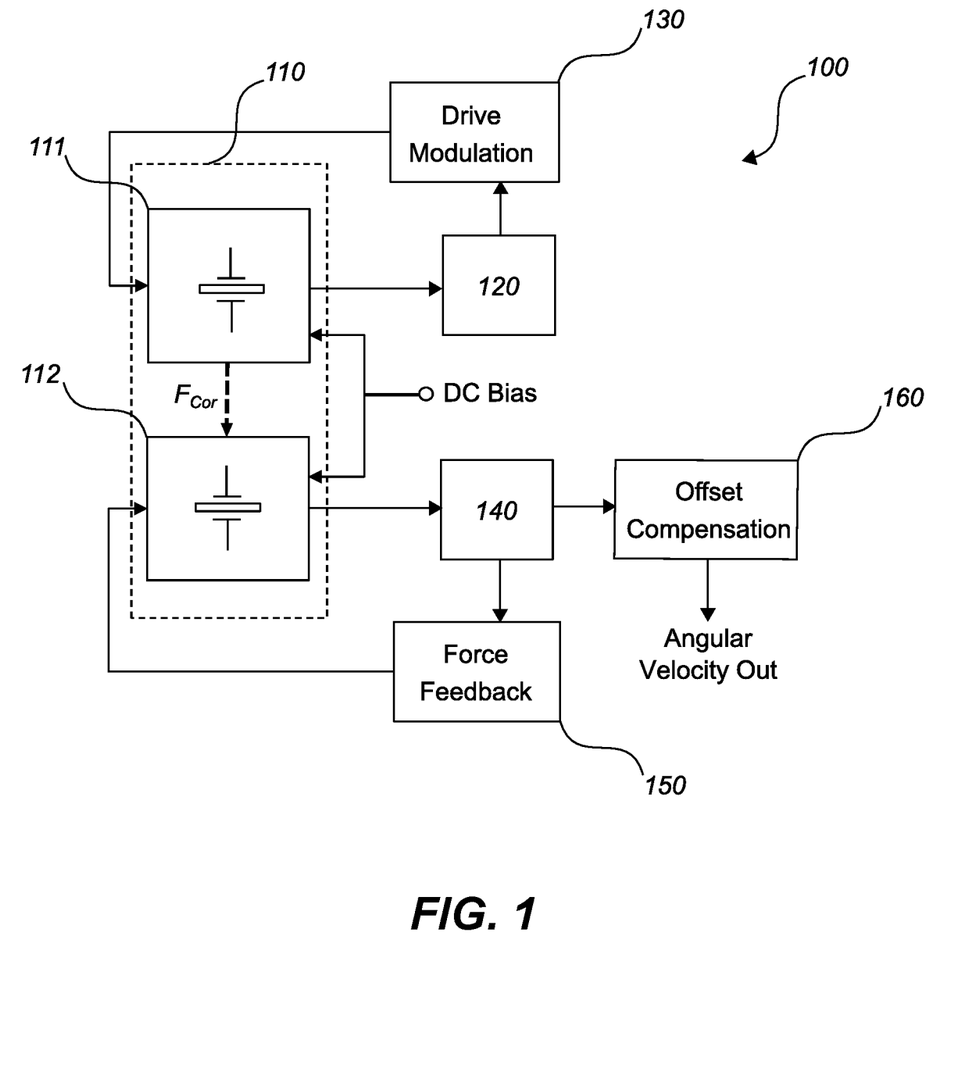
FIG. 1 illustrates a high-level schematic of digital gyroscope.

FIG. 1 illustrates a high-level schematic of a MEMS gyroscope 100. An electro-mechanical MEMS gyro element 110 may be characterized by the two main motions: primary and secondary motion. The MEMS gyro element 110 may comprise a moving mass, i.e. a proof mass, in a single MEMS element capable for both primary and secondary motions, or it may comprise two or more MEMS elements and moving masses. For simplicity, FIG. 1 illustrates a MEMS element with two resonators, a primary resonator 111 and a secondary resonator 112, the latter of which may also be called as a detection element or a sensing element. At least one primary mass of the primary resonator 111 is driven into a stable primary oscillation with a closed primary drive loop, which includes primary drive loop circuitry 120 and drive modulation circuitry 130. Movement of the primary mass(es) is coupled to at least one secondary mass of the secondary resonator 112. A Coriolis force $F_{Cor}$ caused by angular velocity about a rotation axis orthogonal to both the primary 111 oscillation and secondary 112 oscillation causes movement of at least one secondary mass of the secondary resonator 112. The movement of the secondary mass(es) of the secondary resonator 112 is detected by the secondary loop circuitry 140. The secondary loop circuitry 140 produces an electrical rate signal indicating the rate of angular change (i.e. angular velocity) detected by the sensor device about the defined detection axis. The secondary loop also includes force feedback circuitry 150 for producing a force feedback signal to be applied to the secondary mass(es) of the secondary resonator 112. The configuration and operation of the force feedback circuitry 150 is described in, for example, WO2017/195020A1, the disclose of which is incorporated by reference.

The rate signal output from the secondary loop circuitry 140 is input to offset compensation circuitry 160. The output of offset compensation circuitry 160 is the offset-compensated angular velocity output. The offset compensation circuitry 160 is described in more detail with respect to FIGS. 2 and 5 below.

In a MEMS gyroscope according to the embodiments of the invention, the primary resonator 111 and secondary resonator 112 are preferably biased with a common rotor voltage. The primary mass(es) of the primary resonator 111 are driven by electrostatic actuators, for example a linear comb capacitor, and movement of the secondary mass(es) of the secondary element 112 is similarly detected by a capacitive sensor (for example, as also a linear comb capacitor). The primary element 111 typically also includes a capacitive sense interface, the signal of which is used in the primary loop circuitry 120, mentioned above. The secondary element 112 typically also includes an electrostatic actuator for providing the force feedback from force feedback circuitry 150 to the secondary element 112.

The DC bias provides a steady DC bias voltage over all signal capacitances of the electrostatic actuator(s) and capacitive sensor(s) in the primary 111 and secondary elements 112 of the MEMS gyroscope 100. For example, a DC bias voltage between 5 Volts and 20 Volts may be applied. One exemplary way to bias the primary 111 and secondary elements 112 is to couple the same bias voltage to all moveable half-combs (primary and secondary masses) with the same bias voltage, which causes the moveable half combs to have a DC voltage which is either higher or lower than the DC voltage level of all the respective fixed half-combs. However, several alternatives exist for DC biasing, and DC biasing of primary 111 and secondary elements 112 may even use different bias voltages.

It is beneficial for driving (excitation) functionality that a high DC bias voltage provides a strong electrostatic force for driving the primary element 111.

For detection (sensing) functionality, a DC bias voltage over a varying capacitance between the sensor electrodes causes a signal current to be generated in the sensor electrodes whenever the capacitance changes. In an ideal system, no signal current is generated if capacitance remains unchanged. This changing current may be detected with the primary loop circuitry 120 and/or secondary loop circuitry 140.

A vibratory MEMS gyroscope operates at a resonance frequency $f_{RES}$, so that even when the MEMS gyroscope is subject to a constant rotation rate, it provides a changing current through the electrodes.

As mentioned above with respect to FIG. 1, the offset cancelling circuitry 160 receives the rate signal output by the secondary loop circuitry 140 as input. The rate signal is proportional to the rate of change of angular position of the gyroscope around the gyroscope's sense axis. Ideally, the oscillation of the secondary element is caused only by rotation of the gyroscope and the consequently Coriolis force. However, as mentioned above, in practice the rate signal includes unwanted effects caused by the drive signal which results in an offset, i.e. a non-zero rate signal when the external rate of rotation is, in fact, zero. In order to determine the extent of the drive signal's effect on the rate signal and subsequently counteract or cancel it in the rate signal, the MEMS gyroscopes 100 of the present invention modulate the normally continuous drive signal, which alternates the primary oscillation amplitude, and use the resulting modulation of the drive signal's effect on the rate signal to determine the extent of the drive signal's effect on the rate signal.

Figure 2:
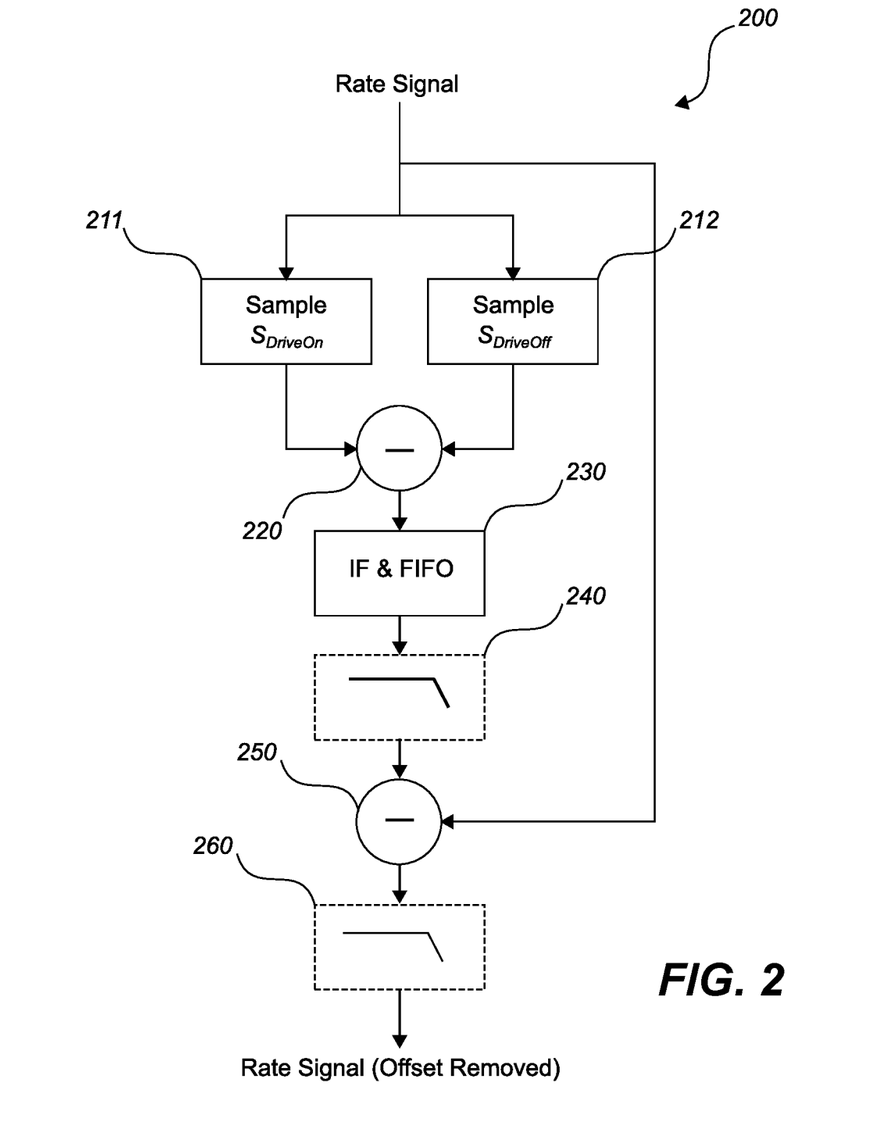
FIG. 2 depicts offset cancelling circuitry according to a first embodiment of the invention.

A first embodiment of the invention is characterised by a drive signal modulation scheme in which the drive signal turned on and off repeatedly. A schematic of the offset cancelling circuitry of the first embodiment is shown in FIG. 2, and the drive signal modulation is shown in more detail in FIGS. 4 and 5.

Figure 6:
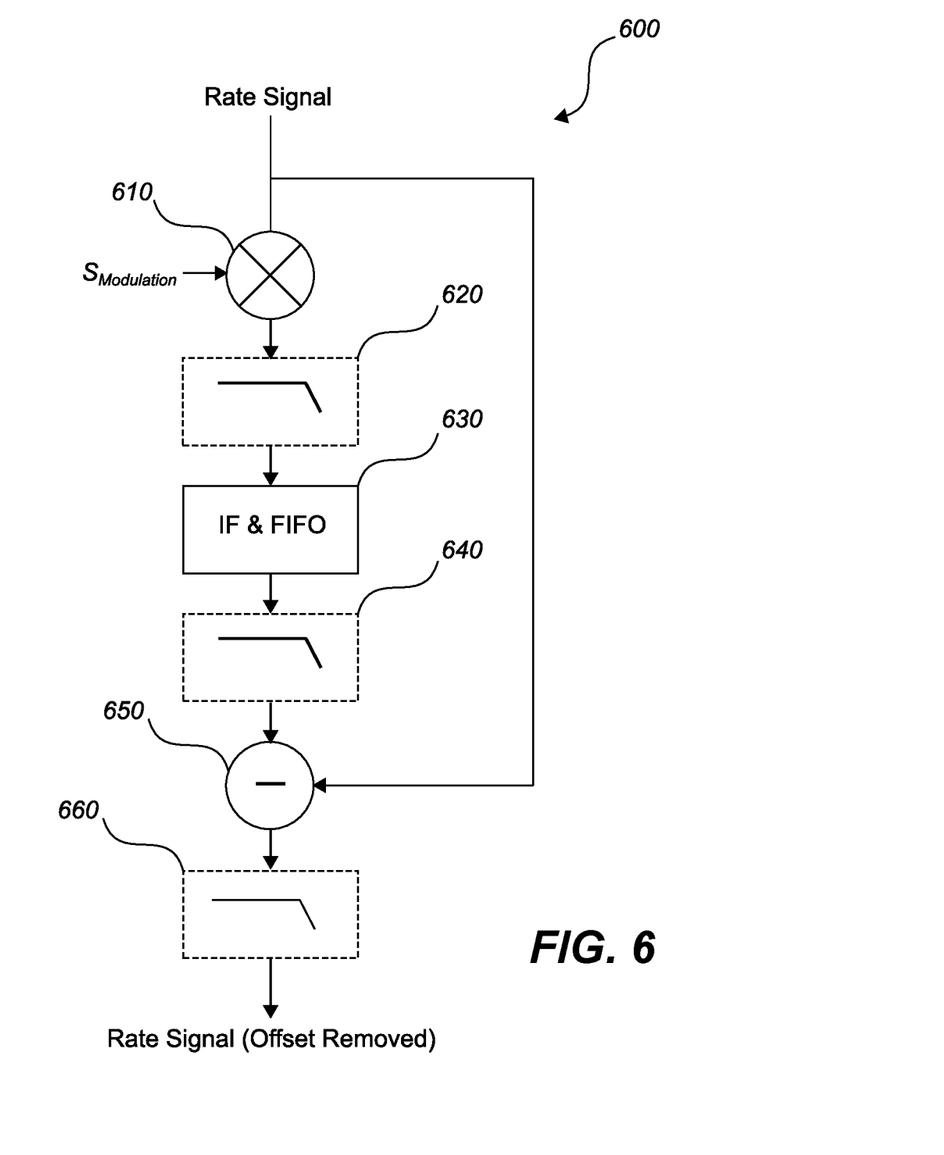
FIG. 6 depicts the function of the offset cancelling circuitry according to a second embodiment of the invention.
Figure 7:
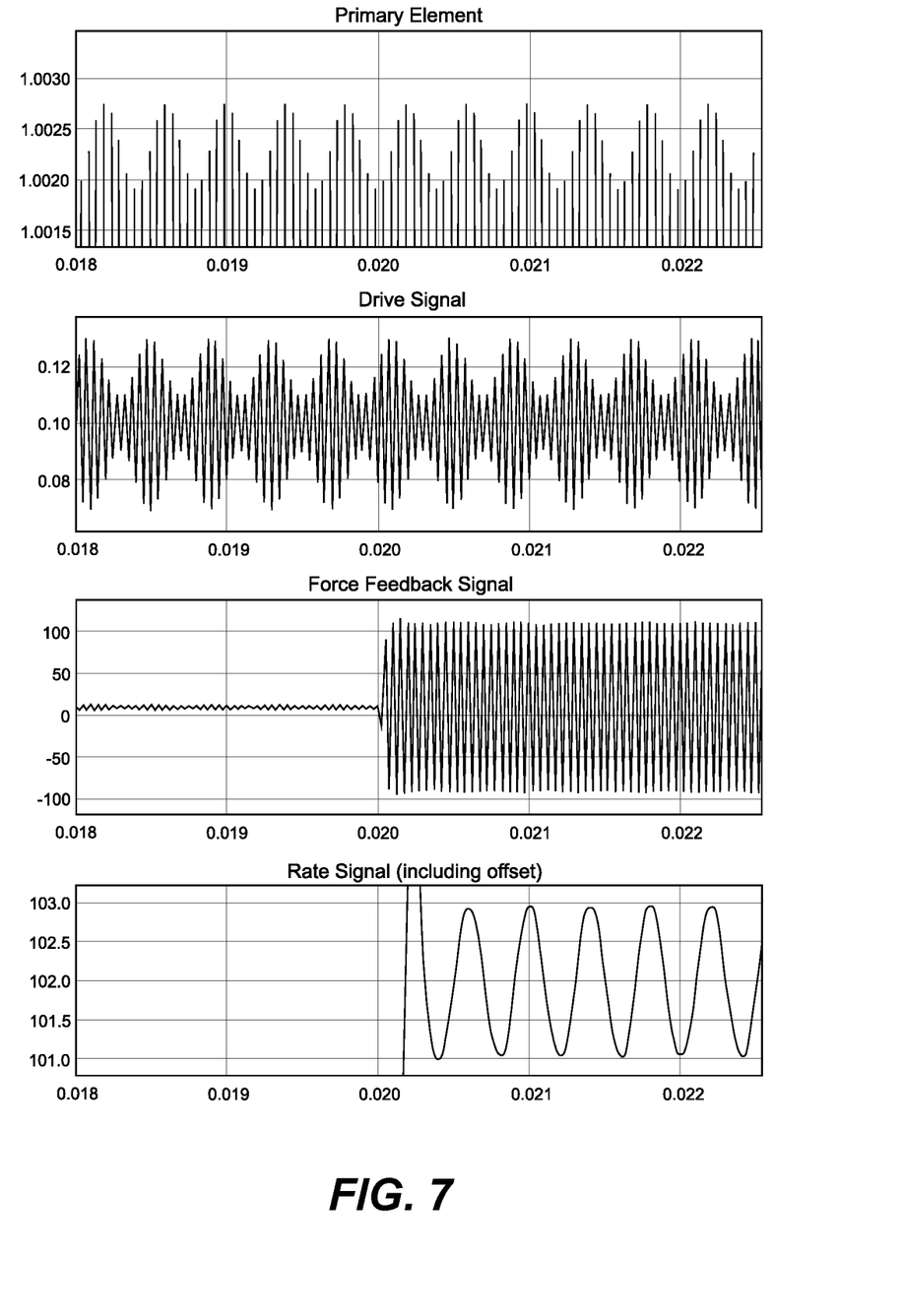
FIG. 7 show plots of the behaviour of the MEMS gyroscope according to the second embodiment of the invention.

A second embodiment of the invention is characterised by a continuous modulation scheme in which the drive signal is modulated linearly. A schematic of the offset cancelling circuitry of the second embodiment is shown in FIG. 6, and the drive signal scheme is shown in more detail in FIG. 7.

In both the first and second embodiments, the electrostatic drive force is proportional to the product $F_{Drive}=V_{DC}\cdot V\_AC$, where $V_{DC}$ is the DC bias voltage and $V_{AC}$ is the AC component of the drive signal. It is therefore possible to produce the drive force modulation by changing either $V_{DC}$ or $V_{AC}$. For the present invention, it is not essential that one or the other be used to modulate the drive signal, and, depending on when automatic gain control (AGC) operation is implemented using AC gain control or DC control, the use of one or the other of $V_{DC}$ or $V_{AC}$ may be more suitable from hardware complexity standpoint.

Both embodiments of the invention take advantage of the oscillation properties of a MEMS gyroscope with force feedback functionality. In such a gyroscope, the Q value of the primary resonator 111 is very high while the Q value of the secondary resonator 112, which is damped by the force feedback circuitry, is much lower. This means that when the drive force changes, the primary resonator 111 needs a relatively long time to settle into a new steady state (or close to a steady state) in response to the new force condition. In contrast, the secondary resonator 112 settles rapidly due to its frequency response as set by the force feedback loop. Thus, changes in the drive signal have relatively slow effect on the primary element 111, and therefore relatively slow effect on the component of the oscillation of the secondary element 112 caused by the Coriolis effect, but the effects of the drive signal on the secondary oscillator are more rapid. Thus, while the invention is described herein with respect to a MEMS gyroscope having force feedback functionality, it will be appreciated that the invention is applicable to any MEMS gyroscope in which the Q value of the secondary element is significantly lower than the Q value of the primary element.

In existing gyroscopes including force feedback circuitry, the closed loop, i.e. the secondary resonator plus force feedback system, is formed from the secondary MEMS resonator, a filter (e.g. a second order low-pass filter or a band-pass filter) and an amplifier. Preferably, the filter is an analogue filter, since no analogue to digital or digital to analogue conversion is required.

When the filter Q value is high, the Q value of the closed loop is also high and vice versa. The Q value of the filter is typically set to minimise disturbances caused by resonant behaviour of the oscillator. However, faster settling step response can be attained when the closed-loop transfer function of magnitude is as flat and as wide as possible with no local gain maxima. This is achieved in the present invention by using lower Q values for the filter, i.e. below 3, and preferably in the range of 1 to 2. Ultimately, by making the gain range of the closed loop as flat and as wide as possible, the settling speed of the closed loop, and therefore the secondary MEMS resonator, is increased.

Another way to define the response of the primary and secondary elements is via settling time, i.e. the time elapsed from a change in the input to the element to the time at which the motion of the oscillator reaches a steady state, within a specified error band. Through the use of the force feedback loop, the secondary element of the gyroscope of the present invention can achieve a settling time of less than 0.5 ms with 1% precision.

First Embodiment

FIG. 2 depicts the function of offset cancelling circuitry 160/200 according to the first embodiment of the present invention. As mentioned above, in the first embodiment the drive signal is modulated such that the drive force is turned on and off repeatedly, i.e. the drive force is zeroed and fully enabled repeatedly. This type of modulation scheme typically has the drawback that the maximum rate of on/off switching is limited by the ringing time of the secondary resonator. Thus, in a conventional MEMS gyroscope without force feedback (or any MEMS gyroscope with a slower settling time) the rate of on/off switching would be severely limited to the extent that it would not be practical to use. However, in the present case, where the secondary resonator has a much faster settling time than the primary resonator, the rate of on/off switching can be greatly increased.

The offset cancelling circuitry 200 includes sampling elements 211 and 212 configured to sample the rate signal when the effects of the drive signal are present in the rate signal (element 211) and when the drive signal effects are not present in the rate signal (element 212). Of course, in practice, it is not necessary to provide separate components in the electronic circuitry to sample the rate signal at different times, and the function of both elements 211 and 212 may be included in a single component of the electronic circuitry.

Figure 4:
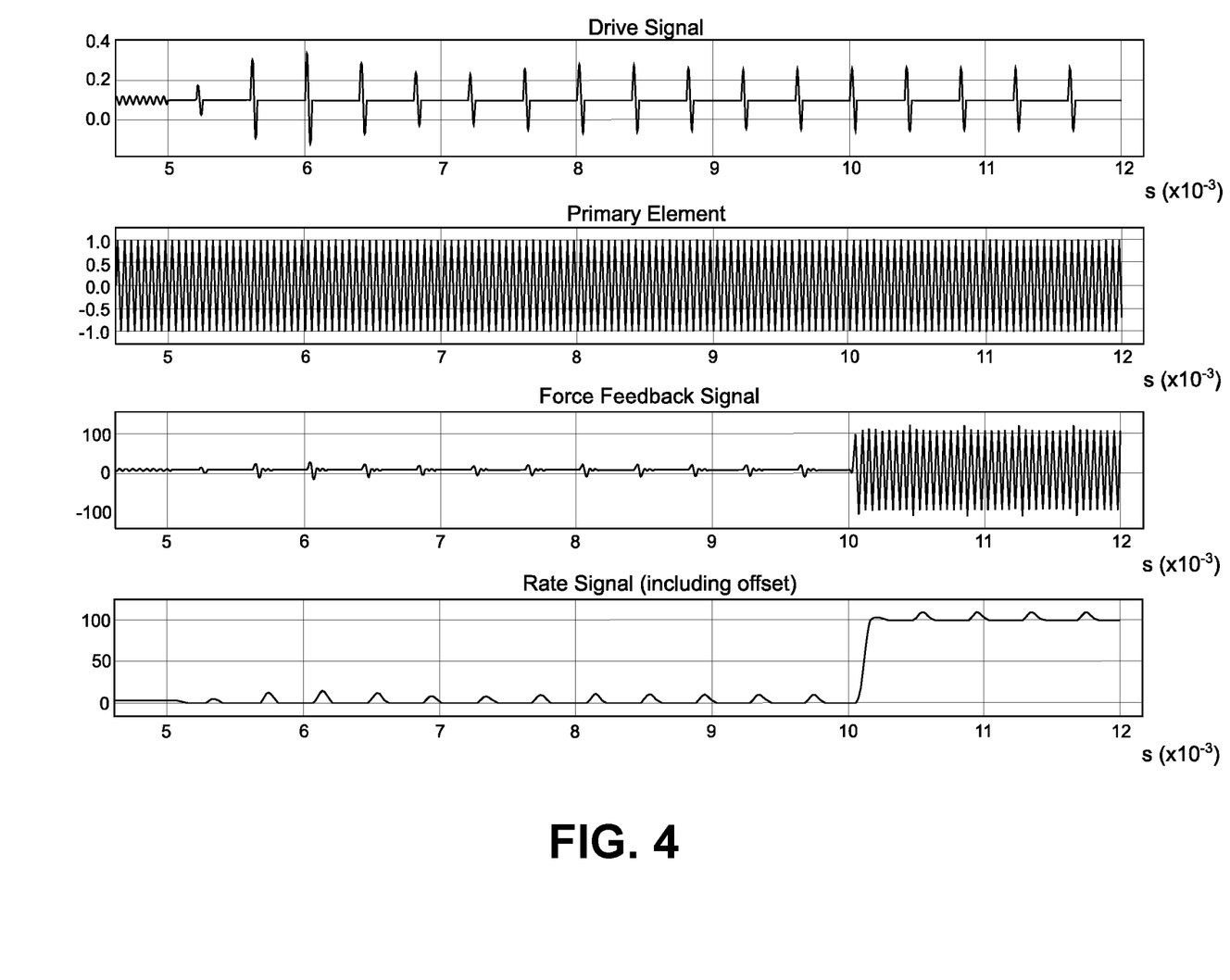
FIG. 4 shows plots of the behaviour of the MEMS gyroscope according to the first embodiment of the invention.

The average values of the sampled signal data obtained at sampling elements 211 and 212 during each time slot (i.e. when the drive signal effect is present, and when the drive signal effect is not present) is calculated to form new data streams, $S_{DriveOn}$ and $S_{DriveOff}$. These data streams can then be used to calculate the offset value. The offset value must also be scaled according to the relative durations of the time during which the drive signal effect is present in the rate signal and the time during which the drive signal effects are not present. Thus, the offset value can be calculated as $M \cdot (S_{DriveOn} - S_{DriveOff})$, where M is the scaling factor. For example, as shown in FIG. 4, where the ratio of the time during which the drive signal effect is present in the rate signal to the time during which the drive signal effect is not present is 3:1, the scaling factor M is ¾. Of course, this value is simply provided as an example and will vary depending on the Q factor/settling time of the secondary resonator 112 (e.g. the Q value of the secondary resonator loop at force feedback output), the length of time for which the drive signal is enabled, and the frequency of on/off switching of the modulation scheme, amongst other factors.

FIG. 2 shows a subtraction element 220 where the value $S_{DriveOn} - S_{DriveOff}$ is calculated. The resulting value is then passed to IF & FIFO element 230 which, amongst other function described in more detail with respect to FIG. 3, multiplies the value $S_{DriveOn} - S_{DriveOff}$ by the scaling factor M. It will be appreciated that it is not necessary for the operations to be carried out in this specific order or by the specific elements depicted in FIG. 2, as long as the offset value $M \cdot (S_{DriveOn} - S_{DriveOff})$ is calculated before the second subtraction element 250 is reached. At subtraction element 250, the offset value is subtracted from the rate signal to produce the offset-corrected rate signal.

In the system of the present invention, it is possible for the on-off frequency of the drive modulation scheme to be set as high as 2 kHz. It is therefore possible to filter the data after offset reduction. This allows the noise and out-of-band signal components from rate data and from the offset reduction data to be removed simultaneously in a low pass filter 260. No significant folding should occur as the IF & FIFO functionality, described with more detail with respect to FIG. 3 below, keeps the offset cancellation signal free of folded noise and the rate signal itself can be read continuously and is originally free of folding effects. However, if the rate signal bandwidth needs to stay significantly higher than the bandwidth of offset reduction, e.g. 100 Hz, while offset cancellation requires significantly lower BW, e.g. 10 Hz, it is feasible to limit the offset reduction data bandwidth in low pass filter 240.

Figure 3:
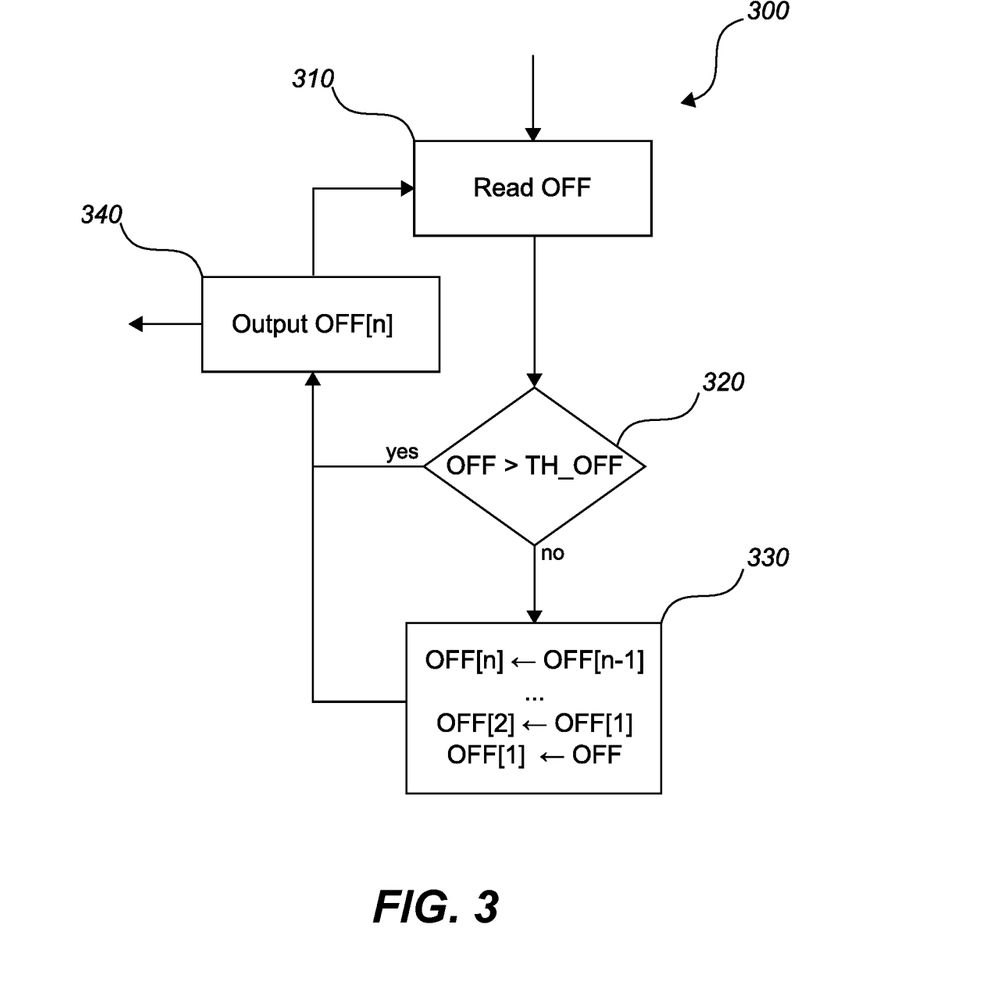
FIG. 3 depicts a IF & FIFO element of both the first and second embodiments.

FIG. 3 shows an IF & FIFO element 300, such as the IF & FIFO element 230 of FIG. 2, in more detail. The primary function of IF & FIFO element 300 is to detect any external signals in the vicinity of on-off frequency and to prevent the external signals from impacting the determined offset value. As described above, the IF & FIFO element 300 may also be responsible for applying the scaling factor to the offset value.

At block 310, an offset value OFF produced by the subtraction element 220 is read by the IF & FIFO element. At block 320, a threshold value, TH_OFF, is used to detect if the offset is higher than would be expected for drive-induced offset. TH_OFF may be simply a constant fixed parameter, or it may be calculated using shift register output samples, e.g. TH_OFF=TH_OFF_FIXED+average (OFF[1 . . . n−1]). In this case, the average value can be calculated to reduce noise effect, while TH_OFF_FIXED should be selected to be high enough to allow proper operation in start-up and despite noise.

If the read offset value OFF is greater than the threshold value TH_OFF, the offset value OFF is discarded as the process moves to block 340.

If the offset value OFF is less than (or equal to) the threshold value TH_OFF, processing proceeds to block 330, where the OFF is enqueued to a FIFO (First In First Out) queue and the first element in the queue, OFF[n] is dequeued.

Following block 330 if OFF was less than or equal to TH_OFF, or following block 320 if OFF was greater than TH_OFF, the first element in the FIFO queue, OFF[n] is output by the IF & FIFO element 300 for use by the subtract element 250 of the circuitry 200 to remove the offset from the rate signal.

It will be appreciated that while block 320 is shown with a strict greater than inequality, the inequality could equally be non-strict, i.e. greater than or equal.

Even when a constant value for TH_OFF is used, multiple offset values OFF[1] to OFF[n] are held in the FIFO queue and are delayed with respect to the rate signal. Thus, even if the offset value OFF produced by subtraction element 220 exceeds the TH_OFF threshold, another offset value is provided from the FIFO queue and the offset can still be removed from the rate signal.

Figure 5:
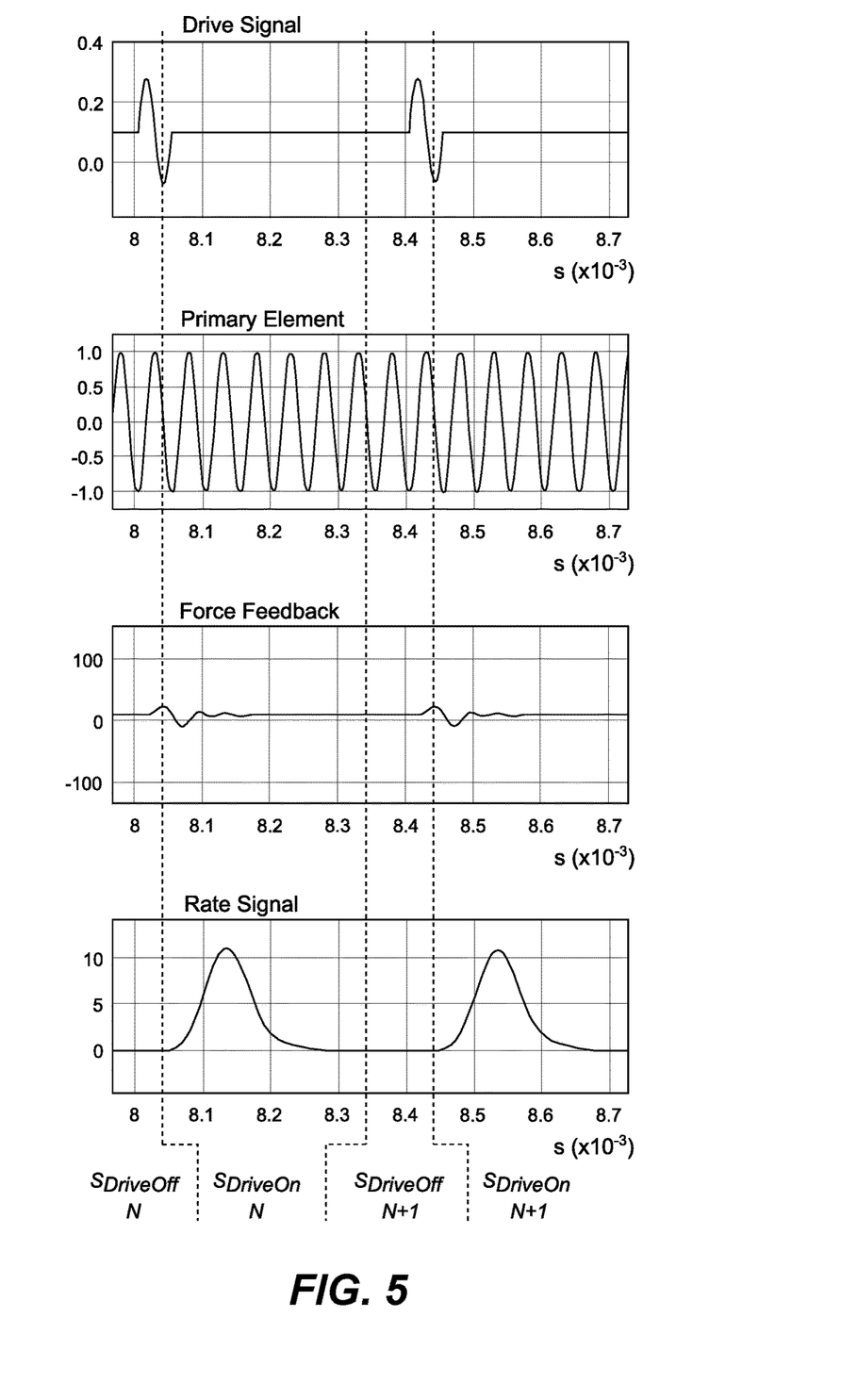
FIG. 5 shows more detail of the plots shown in FIG. 4.

FIGS. 4 and 5 show the modulation scheme and the behaviour of the MEMS gyroscope in the first embodiment in more detail. Both figures include four plots, which show the modulated drive signal, the oscillation of the primary resonator, the force feedback signal applied to the secondary element, and the rate signal, which has been demodulated from the sensed oscillation of the secondary element, but has not had the drive-signal induced (offset) error cancelled.

In FIG. 4, the external rate, i.e. the rate at which the gyroscope is rotating about its sense axis, is zero until a rotation of 100 dps is applied to the gyroscope at 10 ms. As shown in FIG. 4, before 5 ms, the drive signal is a simple oscillating waveform, without the modulation scheme applied. This is reflected in the force feedback signal, which shows a corresponding oscillation, and in the rate signal, which shows a constant offset from the true value of zero. After 5 ms, the drive signal is switched to the on/off modulation scheme. In the present example, the drive signal is in the on-state for 1 period out of every 8. The simple oscillating waveform before 5 ms is part of the start-up process for the primary element's oscillation. By using a continuous waveform to start the oscillation of the primary element, the length of time required to reach a stable oscillation is shortened.

After the start-up is complete at 5 ms, the impulse provided by the regular on-states maintains the oscillation created by the continuous start-up. This is shown in more detail in the oscillation of the primary element. While it is not discernible from the figure, the amplitude of oscillation of the primary element changes only by about 0.3% between drive on/off periods after the switch to the on-off modulation scheme after 5 ms. In the depicted in FIGS. 4 and 5, the Q value of the primary oscillator is 5000, which is still moderately low. If the Q value of the primary oscillator were 20000, the variation in the amplitude of the primary oscillator would be less than 0.1%.

As can be seen in the bottom plot of FIG. 4, the on-off modulation scheme of the drive signal is reflected in the rate signal. However, in contrast to the time before 5 ms when the continuous drive signal is applied, the peak in the rate signal caused by the drive signal drops off to zero before the next peak caused by the next drive signal on-period. This is illustrated in more detail in FIG. 5.

FIG. 5 shows a more detailed section of the plots shown in FIG. 4. The period of the peaks in the rate signal is broken down into sections labelled $S_{DriveOff}$ and $S_{DriveOn}$. Pairs of sections $S_{DriveOff}$ and $S_{DriveOn}$ are labelled with the index N, N+1 etc. $S_{DriveOff}$ is the section of the period of the drive-induced peaks in the rate signal during which the effect of the drive signal on the rate signal is zero. $S_{DriveOn}$ is the section of the period of the drive-induced peaks in the rate signal during which the effect of the drive signal on the rate signal is non-zero. It will be appreciated that the boundaries between adjacent $S_{DriveOn}$ and $S_{DriveOff}$ sections do not need to be perfect, i.e. beginning and ending at the moments where the drive signal effect transitions from zero to non-zero; however, it is important that the boundary be set such that the $S_{DriveOff}$ section includes the minimum amount of drive signal effect, since this provides the baseline for the correct, i.e. without drive signal induced offset, value of the rate signal.

As described above with respect to FIG. 2, once the rate signal sections $S_{DriveOn}$ and $S_{DriveOff}$ have been measured and averaged, the offset values is calculated as M. ($S_{DriveOn}$ − $S_{DriveOff}$). In the case depicted in FIG. 5, length of $S_{DriveOn}$ is three times the length of $S_{DriveOff}$. Thus, scaling factor M is ¾.

Second Embodiment

FIG. 6 depicts the function of offset cancelling circuitry 160/600 according to the second embodiment of the present invention. As mentioned above, in the second embodiment the drive signal is modulated linearly, such that the drive force varies continuously. In a gyroscope where the secondary element has a significantly lower Q value than the primary elements, such as a gyroscope including force feedback functionality, the modulation of the drive signal in this way has very little effect on the motion of the primary element 111, but has a clear effect on the rate signal. Indeed, using the modulation scheme depicted in FIG. 6 (with an exemplary modulation depth of 50%), the primary resonator 111 with a moderate Q value of 5000 has only 0.08% peak-to-peak variation.

The drive signal has two components: a DC component and an AC component. By recovering the AC component of the rate signal offset and comparing it to the AC component of the drive signal, the magnitude of the DC offset can be determined from the DC component of the drive signal.

At multiplier element 610, the rate signal (including the offset) is received from the secondary loop circuitry 140 and multiplied by the signal $S_{MODULATION}$, referred to as a modulation carrier wave, which has the same frequency as the signal that is used to modulate the drive signal. The phase of $S_{MODULATION}$ is matched with the phase of the drive induced ripple in the rate signal (shown in more detail in FIG. 6). The output of the multiplier element 610 can be written in form:

$$D_{OUT} = S_{MOD\_AMP} \sin(\omega t) \cdot F_{MOD\_AMP} \sin(\omega t)$$
$$= S_{MOD\_AMP} \cdot F_{MOD\_AMP} \sin^2(\omega t)$$

Where $S_{MOD\_AMP}$ is the amplitude of the signal $S_{MODULATION}$ and $F_{MOD\_AMP}$ is the amplitude of the ripple in the rate signal caused by the modulation of the drive signal. The output of the multiplier 610 is filtered through low-pass filter 620 to remove the $\sin^2(\omega t)$ component of the multiplied signals, leaving two known values −$D_{OUT}$ and $S_{MOD\_AMP}$—and one unknown value, $F_{MOD\_AMP}$, which can be calculated from the other two. Furthermore, from the ratio of $F_{MOD\_AMP}$ to the amplitude of the modulation of the drive signal, the DC component of the offset can also be calculated.

Following the low-pass filter 620 is the IF & FIFO element 630, which may carry out the calculation of the AC and DC offsets as described above. Otherwise, the IF & FIFO element 630 operates essentially as described above with respect to FIG. 3. A further low-pass filter 640 may be provided following the IF & FIFO element 630, which serves the same purpose as low-pass filter 240 shown in FIG. 2.

At subtraction element 650, the offset calculated by elements 610 to 640 is subtracted from the rate signal to output the rate signal with the drive-induced offset removed. Low pass filter 660 performs the same function in the second embodiment as filter 260 performs in the first embodiment, i.e. sets the final rate signal bandwidth and removes any AC errors caused by the modulation scheme.

Since the drive signal of the second embodiment is continuously modulated, noise aliasing type issues in the drive signal are reduced. Preferably, the modulation depth is set as large as possible while maintaining a linear drive force. In practice, 30-80% of the normal drive force can be set as the selectable modulation range. In an example case, shown in the top two plots of FIG. 7, the drive modulation is set to be 50% of normal drive force. A step of 100 dps occurs in the external rate measured by the gyroscope at time of 20 ms, as shown by the force feedback signal in the second-from-bottom plot of FIG. 7. In the bottom plot of FIG. 7, it can be seen that rate signal (including offset) settles to slightly above 100 dps level and shows the sinusoidal ripple due to drive modulation. It can be also noted that drive motion has only 0.08% peak-to-peak variation despite the only moderate primary Q of 5000. It is also important to confirm that frequency of the modulation of the drive signal is low enough so that it cannot change the drive force modulation into non-linear one. For example, If the amplitude control bandwidth is in the order of few tens of Hz (e.g. 10-30), it is straightforward to limit the non-linear effect that circuit components, such as an AGC, have on the drive modulation.

The invention claimed is:

1. A MEMS gyroscope comprising:
   at least one mechanical resonator;
   drive circuitry configured to apply a drive signal to the at least one mechanical resonator to drive motion of the at least one mechanical resonator in a first direction;
   sense circuitry configured to sense motion of the at least one mechanical resonator in a second direction, the second direction being orthogonal to the first direction, and to output a rate signal proportional to the amplitude of the sensed motion of the mechanical resonator in the second direction;
   wherein the sense circuitry includes a closed force feedback loop forming an electromechanical resonator loop configured to adjust the frequency response of the at least one mechanical resonator in the second direction;
   wherein the drive circuitry is further configured to modulate the drive signal by alternating between a drive-on state and a drive-zero state; and
   the MEMS gyroscope further comprises offset compensation circuitry comprising electronic circuitry configured to determine a direct effect of the drive signal on the sense signal based on the modulation of the drive signal and to counteract the direct effect of the drive signal on the rate signal, wherein the offset compensation circuitry is configured to:
      determine an average value of the demodulated rate signal for a time period during which the direct effect of the drive signal is present in the rate signal;
      determine an average value of the demodulated rate signal for a time period during which the direct effect of the drive signal is substantially not present in the rate signal; and
      calculate the difference between the average value when drive effect is present and the average value when the drive effect is not present to determine a first offset value.

2. The MEMS gyroscope of claim 1, wherein a settling time of at least one electromechanical resonator loop in the second direction is significantly shorter than a settling time of at least one mechanical resonator in the first direction.

3. The MEMS gyroscope of claim 1, wherein the settling time of at least one electromechanical resonator in the second direction is less than 0.5 ms with 1% precision.

4. The MEMS gyroscope of claim 1, wherein the sense circuitry is configured to sense the motion of at least one mechanical resonator capacitively.

5. The MEMS gyroscope of claim 1, wherein the closed force feedback loop comprises the mechanical resonator, a filter and an amplifier, and wherein the Q value of amplifier is below 3, preferably between 1 and 2.

6. The MEMS gyroscope of claim 1, wherein:
   at least one mechanical resonator comprises a first mechanical resonator and a second mechanical resonator;
   the first mechanical resonator is configured to move in the first direction and the second mechanical resonator is configured to move in the second direction; and
   the first mechanical resonator and second mechanical resonator are coupled such that rotation of the MEMS gyroscope about an axis orthogonal to both the first direction and second direction causes excitation of the second mechanical resonator in the second direction.

7. The MEMS gyroscope of claim 1, wherein "substantially not present" means that the drive effect in the rate signal is less than 30% of the maximum drive effect.

8. The MEMS gyroscope of claim 1, wherein the offset compensation circuitry is further configured to:
   determine if the first offset value is lower than a threshold offset value and, if the first offset value is lower than the threshold offset value:
      enqueue the first offset value to a FIFO queue and dequeue an offset value from the FIFO queue;
      output the dequeued value from the FIFO queue as a second offset value;
   if the offset value is higher than the threshold offset value:
      output the first value from the FIFO queue as the second offset value.

9. The MEMS gyroscope of claim 8, wherein the threshold offset value is a constant.

10. The MEMS gyroscope of claim 8, wherein offset compensation circuitry is further configured to calculate the threshold offset value by calculating the sum of a fixed offset and an average offset value of some or all of the offset values stored in the FIFO queue.

11. The MEMS gyroscope of claim 7, wherein the offset compensation circuitry is further configured to determine a third offset value by scaling the first or second offset value by the ratio of the time period during which the direct effect of the drive signal is present in the rate signal to the time period during which the direct effect of the drive signal is not present in the rate signal.

12. The MEMS gyroscope of claim 7, wherein the offset compensation circuitry is further configured to subtract the second or third offset value from the rate signal to produce an offset-corrected rate signal.

13. The MEMS gyroscope of claim 1, wherein the drive circuitry is configured to alternate between the drive-on and drive-zero states at a frequency of at least 100 Hz.

14. The MEMS gyroscope of claim 1, wherein the drive-on state is maintained for approximately ⅛ of the period of alternation.

15. A MEMS gyroscope comprising:
at least one mechanical resonator;
drive circuitry configured to apply a drive signal to at least one mechanical resonator to drive motion of at least one mechanical resonator in a first direction;
sense circuitry configured to sense motion of at least one mechanical resonator in a second direction, the second direction being orthogonal to the first direction, and to output a rate signal proportional to amplitude of the sensed motion of the mechanical resonator in the second direction;
wherein the sense circuitry includes a closed force feedback loop forming an electromechanical resonator loop configured to adjust the frequency response of the at least one mechanical resonator in the second direction;
wherein the drive circuitry is further configured to modulate the drive signal linearly; and
the MEMS gyroscope further comprises offset compensation circuitry comprising electronic circuitry configured to determine a direct effect of the drive signal on the sense signal based on the modulation of the drive signal and to counteract the direct effect of the drive signal on the rate signal,
wherein the offset compensation circuitry is further configured to:
receive a modulation carrier wave, wherein the modulation carrier wave has the same frequency as the drive signal modulation;
match the phase of the modulation carrier wave to the phase of a ripple in the rate signal caused by the modulation of the drive signal;
multiply the modulation carrier wave and the rate signal and filter out high frequency components of the multiplied signal;
determine an AC offset magnitude based on amplitude of the multiplied and filtered signal and amplitude of the modulation carrier wave;
determine a DC offset based on the DC component of the drive signal and the ratio of the AC offset to the AC component of the drive signal; and
combine the AC offset and DC offset to determine a first offset value.

16. The MEMS gyroscope of claim 15, wherein the modulation depth of the drive signal is between 30% and 80% of the unmodulated drive signal.

17. The MEMS gyroscope of claim 15, wherein the offset compensation circuitry is further configured to determine if the first offset value is lower than a threshold offset value and, if the first offset value is lower than the threshold offset value:
enqueue the first offset value to a FIFO queue and dequeue an offset value from the FIFO queue and output the dequeued value from the FIFO queue as a second offset value;
and if the first offset value is higher than the threshold offset value:
output the first value from the FIFO queue as the second offset value.

18. The MEMS gyroscope of claim 15, wherein the offset compensation circuitry is further configured to subtract the first or second offset value from the rate signal to produce an offset-corrected rate signal.

19. The MEMS gyroscope of claim 15, wherein a settling time of at least one electromechanical resonator loop in the second direction is significantly shorter than a settling time of at least one mechanical resonator in the first direction.

20. The MEMS gyroscope of claim 15, wherein the settling time of at least one electromechanical resonator in the second direction is less than 0.5 ms with 1% precision.

21. The MEMS gyroscope of claim 15, wherein the sense circuitry is configured to sense the motion of at least one mechanical resonator capacitively.

22. The MEMS gyroscope of claim 15, wherein the closed force feedback loop comprises the mechanical resonator, a filter and an amplifier, and wherein the Q value of amplifier is below 3, preferably between 1 and 2.

23. The MEMS gyroscope of claim 15, wherein:
at least one mechanical resonator comprises a first mechanical resonator and a second mechanical resonator;
the first mechanical resonator is configured to move in the first direction and the second mechanical resonator is configured to move in the second direction; and
the first mechanical resonator and second mechanical resonator are coupled such that rotation of the MEMS gyroscope about an axis orthogonal to both the first direction and second direction causes excitation of the second mechanical resonator in the second direction.

* * * * *